United States Patent [19]

Kitada et al.

[11] Patent Number: 4,814,919
[45] Date of Patent: Mar. 21, 1989

[54] SOFT-FILM-BIAS TYPE MAGNETORESITIVE DEVICE

[75] Inventors: Masahiro Kitada, Tokyo; Hideo Tanabe, Hachioji; Noboru Shimizu, Tokorozawa; Yoshihisa Kamo, Kokubunji; Hitoshi Nakamura, Hachioji; Tooru Takeura, Odawara, all of Japan

[73] Assignee: Hitachi, Ltd., Tokyo, Japan

[21] Appl. No.: 124,623

[22] Filed: Nov. 24, 1987

Related U.S. Application Data

[63] Continuation of Ser. No. 828,350, Feb. 11, 1986, abandoned.

[30] Foreign Application Priority Data

Mar. 1, 1985 [JP] Japan .................................. 60-38726

[51] Int. Cl.⁴ ............................................ G11B 5/127
[52] U.S. Cl. ................................................ 360/113
[58] Field of Search ............. 360/113, 122; 338/32 R; 324/252

[56] References Cited

U.S. PATENT DOCUMENTS

| 4,277,808 | 7/1981 | Nagaki | 360/113 |
| 4,503,394 | 3/1985 | Kawakami et al. | 360/113 X |
| 4,626,946 | 12/1986 | Vinal | 360/113 |
| 4,639,806 | 1/1987 | Kira et al. | 360/113 |
| 4,663,684 | 5/1987 | Kamo et al. | 360/113 |

FOREIGN PATENT DOCUMENTS

| 0127918 | 8/1982 | Japan | 360/122 |
| 0108026 | 6/1983 | Japan | 360/113 |
| 0220241 | 12/1983 | Japan | 360/113 |
| 0152521 | 8/1984 | Japan | 360/113 |
| 0165228 | 9/1984 | Japan | 360/113 |

Primary Examiner—Stuart N. Hecker
Assistant Examiner—Andrew L. Sneizek
Attorney, Agent, or Firm—Antonelli, Terry & Wands

[57] ABSTRACT

A soft-film-bias type magnetoresistive device is disclosed in which a high-permeability magnetic film, an insulating film and a permalloy film are formed on a substrate in this order, and first, second and third electrodes, which are parallel to each other, are provided on the permalloy film, to form a differential type magnetoresistive device. In this magnetoresistive device, a bias magnetic field which is generated and applied to the permalloy film between the first and second electrodes, is opposite in direction to a bias magnetic field which is generated and applied to the permalloy film between the second and third electrodes.

11 Claims, 4 Drawing Sheets

FIG. I  PRIOR ART
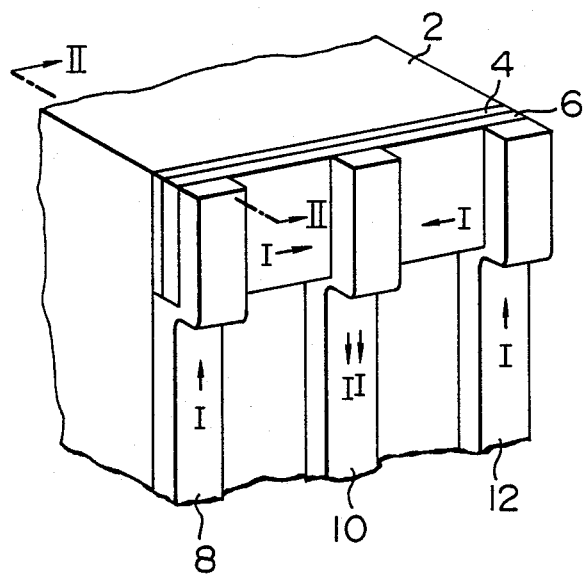
FIG. 2  PRIOR ART
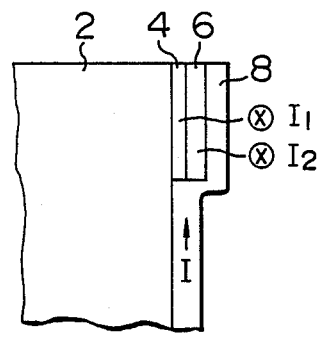

COMPARISON OF OUTPUT VOLTAGE 60  56 ( 54   62
     52   58

NON-DIFFERENTIAL

DIFFERENTIAL 4,814,919

SOFT-FILM-BIAS TYPE MAGNETORESITIVE DEVICE

This application is a continuation of application Ser. No. 828,350, filed Feb. 11, 1986, now abandoned.

BACKGROUND OF THE INVENTION

The present invention relates to a magnetic recording device, and more particularly to differential type magnetoresistive device suitable for use in a reproducing magnetic head.

A differential type device (namely, a differential device) has been fabricated for a barber-pole type magnetoresistive device which is disclosed in Japanese patent application (unexamined publication Nos. 51-124410 and 51-124411), and for a shunt-bias type magnetoresistive device which is disclosed in Japanese patent application (unexamined publication No. 53-25645). In both the differential magnetoresistive device of the barber-pole type and the differential magnetoresistive device of the shunt-bias type, a shunt film made of Ti, Mo, etc. is formed on part or the whole of a thin magnetoresistive film made of permalloy, to shunt a current and to apply a magnetic field generated thereby to the magnetoresistive film. Here, there arises a problem that an output based upon the magnetoresistive effect is reduced by an amount corresponding to a current which flows through the shunt film.

Now, explanation will be made of a differential magnetoresistive device of the shunt-bias type, by way of example. FIG. 1 is a perspective view showing a differential magnetoresistive device of the shunt-bias type, and FIG. 2 is a sectional view taken along the line II—II of FIG. 1. Referring to FIGS. 1 and 2, a high-permeability magnetic film (for example, a permalloy film) 4 which acts as a magnetoresistive element, is formed on a substate 2, and a shunt film 6 made of a metal (for example, titanium or molybdenum) is formed on the permalloy film 4. Further, three parallel electrodes 8, 10 and 12 are formed on the shunt film 6. When a current I is caused to flow from each of the electrodes 8 and 12 to the electrode 10, the current I is divided into a current $I_1$ flowing through the permalloy film 4 and a current $I_2$ flowing through the shunt film 6. That is, $I = I_1 + I_2$. The current $I_2$ forms a bias magnetic field for the permalloy film 4. However, the output of the device due to the magnetoresistive effect is reduced by an amount corresponding to the current $I_2$ which flows through the shunt film 6.

Meanwhile, it has not been studied to form a differential magnetoresistive device of the soft-film-bias type. Here, "soft-film" means a film of soft magnetic material. In a conventional soft-film-bias type magnetoresistive device, there arises a problem that the waveform of an output signal from the device is deficient in symmetry, because a curve indicating the relation between the output voltage of the device and the alternating magnetic field applied to the device is not linear as will be explained later. Thus, the conventional soft-film-bias type magnetoresistive device has a drawback that the output thereof cannot be made large.

SUMMARY OF THE INVENTION

An object of the present invention is to provide a soft-film-bias type magnetoresistive device capable of generating a large output.

In order to increase the output of a soft-film-bias type magnetoresistive device which does not include a current-flowing film kept in contact with a thin magnetoresistive film for generating a bias magnetic field, a soft-film-bias type magnetoresistive device according to the present invention has the following structure. That is, a high-permeability magnetic body is provided in the proximity of a thin magnetoresistive film so that the magnetic body is electrically isolated from and is parallel to the thin magnetoresistive film, to apply a bias magnetic field to the thin magnetoresistive film, and moreover three electrodes are provided on the thin magnetoresistive film to form a differential type device.

BRIEF DESCRIPTION OF THE DRAWINGS

FIG. 1 is a perspective view showing a differential magnetoresistive device of the shunt-bias type.

FIG. 2 is a sectional view taken along the line II—II of FIG. 1.

DESCRIPTION OF THE PREFERRED EMBODIMENTS

Now, explanation will be made on embodiments of a differential magnetoresistive device of the soft-film-bias type according to the present invention, by reference to the drawings.

EMBODIMENT I

Figure 3:
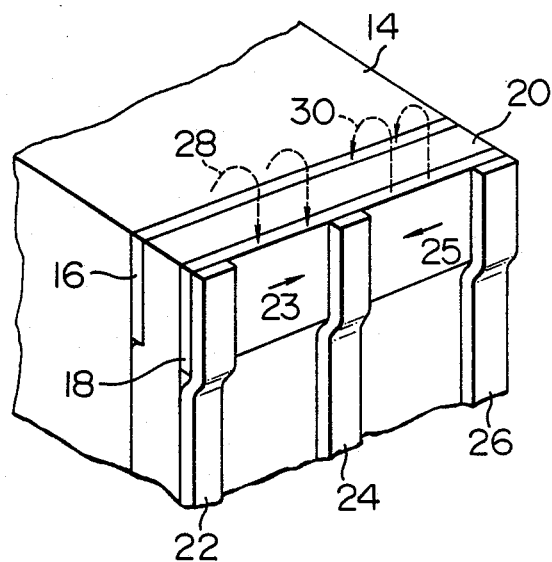
FIG. 3 is a perspective view showing a first embodiment of a differential magnetoresistive device of the soft-film-bias type according to the present invention.

FIG. 3 is a perspective view showing a first embodiment of a differential magnetoresistive device of the soft-film-bias type according to the present invention, and further shows a relationship between the direction of a current flowing through a magnetoresistive film elongated parallel to the direction of the magnetic easy axis and a bias magnetic field generated and applied thereto. The direction of current flow is parallel to the direction of the magnetic easy axis.

Figure 4:
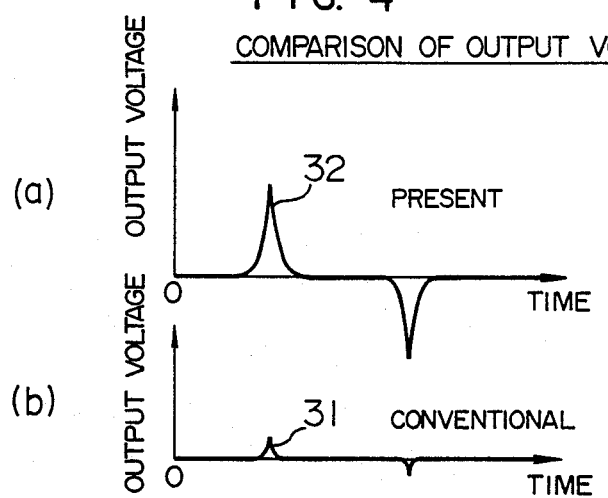
FIG. 4 is a graph for comparing the output characteristics of the first embodiment of FIG. 3 with those of a conventional differential magnetoresistive device of the barber-pole type or shunt-bias type.

Referring to FIG. 3, a high-permeability soft-magnetic film 16 such as a permalloy film is formed on an insulating substrate 14 which is made of glass or ceramics, by evaporation or sputtering techniques, and is then subjected to patterning to have a desired shape. The high-permeability film 16 has a thickness of several nanometers to hundreds of nanometers, and is made of a high-permeability material which contains at least one of ferromagnetic elements such as Co, Fe and Ni as the main component. An insulating film 20 (for example, an $SiO_2$ film or $Si_3N_4$ film) is formed on the high-permeability film 16 and the substrate 14. Then a permalloy film 18 is formed on the insulating film 20 by evaporation or sputtering techniques, and is subjected to patterning to have a desired shape. Thus, the high-permeability film 16 is electrically insulated from the permalloy film 18. Three electrodes 22, 24 and 26 are formed on the permalloy film 18 at regular intervals. When a current is caused to flow through the permalloy film 18 as indicated with arrows 23 and 25, a bias magnetic field 28 of 5 to 30 Oe caused by current 23 is applied to that part of the permalloy film 18 which exists between the electrodes 22 and 24, by the interaction between a magnetic field 28 due to the magnetic action of electric current 23 and the high-permeability film 16. Further, a bias magnetic field 30 which is equal in strength and opposite in direction to the bias magnetic field 28, is caused by current 25 and applied to that part of the permalloy film 18 which exists between the electrodes 24 and 26. Thus, the part of the permalloy film 18 which exists between the electrodes 22 and 24, is magnetized in a direction opposite to that of magnetization in the part existing between the electrodes 24 and 26. In this case, reversion of magnetization occurs at that part of the permalloy film 18 which exists beneath the electrode 24, and hence will provide no disturbances at this position. Further, reversion of magnetization occurs in the high-permeability film 16 at a position corresponding to the electrode 24. When the width of the electrode 24 is greater than or equal to the width of the magnetization reversing region, there arises no problem. Part (a) of FIG. 4 shows an output signal 32 which is reproduced from a magnetic recording medium by the present embodiment, and part (b) of FIG. 4 shows an output signal 31 which is reproduced from the magnetic recording medium by a conventional differential magnetoresistive device of the barber-pole type or shunt-bias type. As is apparent from FIG. 4, the output signal 32 obtained by the present embodiment is far lager than the output signal 31 obtained by the conventional device. This is because, in the conventional device, an output from a differential type magnetoresistive film is reduced by a loss current which flows through a shunt film kept in contact with the magnetoresistive film.

EMBODIMENT II

Figure 5:
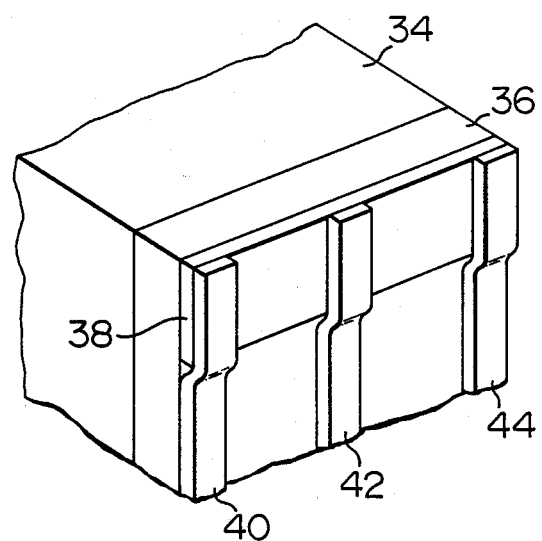
FIG. 5 is a perspective view showing a second embodiment of a differential magnetoresistive device of the soft-film-bias type according to the present invention.

FIG. 5 shows a second embodiment of a differential magnetoresistive device of the soft-film-bias type according to the present invention.

Referring to FIG. 5, a substrate 34 is made of a magnetic ferrite of high permeability and very high resistivity, and a permalloy film 38 is formed on the substrate 34 directly or through a gap layer 36 which is made of $SiO_2$ or others. Here, since the ferrite has a very high resistivity, it is regarded as being electrically isolated from the permalloy film. Electrodes 40, 42 and 44 are formed in the same manner as in the EMBODIMENT I. The present embodiment can produce a large output signal similar to that obtained by the first embodiment of FIG. 3.

EMBODIMENT III

Figure 6:
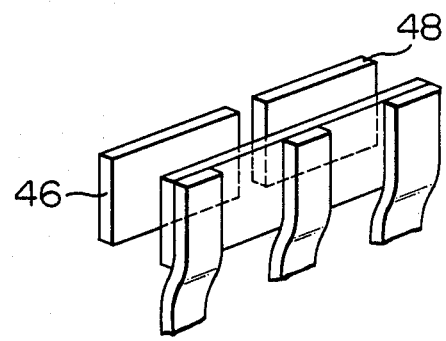
FIG. 6 is a perspective view showing a main part of a third embodiment of a differential magnetoresistive device of the soft-film-bias type according to the present invention, in which a high-permeability film is cut into two separate parts.
Figure 7:
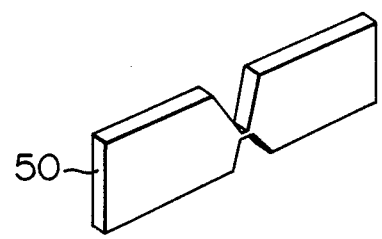
FIG. 7 is a perspective view showing a high-permeability film which has a constricted part and is used in a modified version of the third embodiment.

In a case where the distance between adjacent ones of the electrodes 22, 24 and 26 shown in FIG. 3 is very small, noise is caused by the reversion of magnetization at a central portion of the high-permeability film 16 for generating a bias magnetic field. In this case, the above noise can be eliminated or reduced, by separating the high-permeability film into two parts 46 and 48 as shown in FIG. 6, or by providing a constricted part at the central portion of a high-permeability film 50 as shown in FIG. 7.

EMBODIMENT IV

Figure 8:
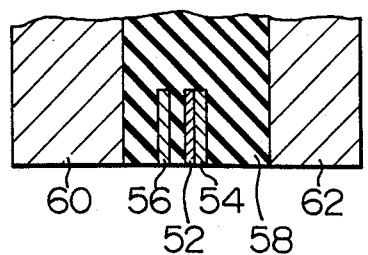
FIG. 8 is a sectional view showing a fourth embodiment of a differential magnetoresistive device of the soft-film-bias type according to the present invention, in which a magnetic shielding body of high permeability is provided.

In the EMBODIMENT I to III, a magnetic shielding body of high-permeability is not used. FIG. 8 shows, in section, a fourth embodiment of a differential magnetoresistive device of the soft-film-bias type according to the present invention. Referring to FIG. 8, the present embodiment includes a permalloy film 52, electrodes 54, a high-permeability film 56 for generating a bias magnetic field, an insulating layer 58, and high-permeability magnetic bodies 60 and 62 for magnetic shielding. The magnetic shielding bodies 60 and 62 may either be massive (bulk) body or a thin film. Owing to the present of the shielding bodies 60 and 62, the present embodiment can produce an output waveform which is very symmetrical and has a half width equal to a fraction of the half width of an output waveform obtained by a conventional device.

Figure 9A:
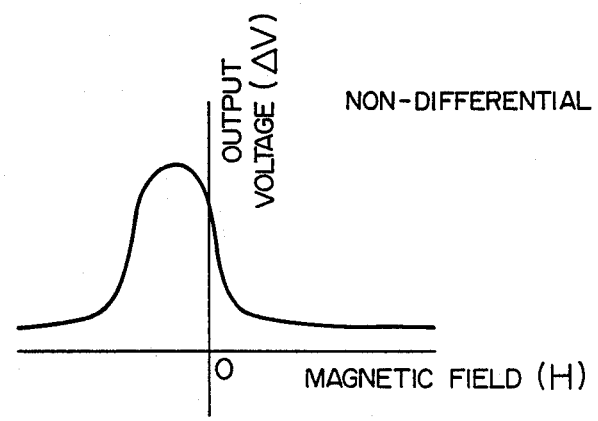
FIGS. 9a and 9b are graphs of output voltage vs. applied magnetic field for the conventional non-differential type device and for the present differential type device, respectively.
Figure 9B:
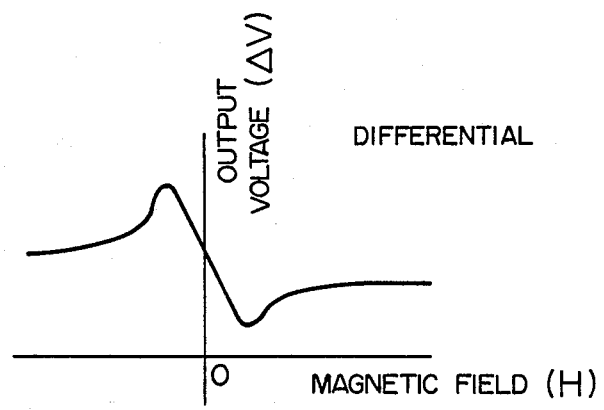

As has been explained in the foregoing, according to the present invention, there is provided a differential magnetoresistive device of the soft-film-bias type, in which a high-permeability film or body is used for generating a bias magnetic file. When the same current is used in both the above device according to the present invention and a conventional differential magnetoresistive device of the barber-pole type or shunt-bias type, the output of the device according to the present invention can be five or six times larger than the output of the conventional device, because a current flowing through a barber-pole electrode or shunt film is absent in the device according to the present invention. Further, the differential magnetoresistive device of the soft-film-bias type according to the present invention is far superior in symmetry of output waveform to a non-differential magnetoresistive device of the soft-film-bias type. This fact will be explained below in more detail, by reference to FIGS. 9a and 9b. FIGS. 9a and 9b show the alternating magnetic file (H) versus output voltage ($\Delta V$) curve of the non-differential magnetoresistive device and the H vs $\Delta V$ curve of the differential magnetoresistive device, respectively. As is apparent from FIGS. 9a and 9b, in the vicinity of H=O, the H−$\Delta V$ curve of the differential device is far superior in linearity to that of the nondifferential device. Thus, the differential magnetoresistive device according to the present invention can improve the symmetry of output waveform.

We claim:

1. A soft-film-bias type magnetoresistive device, comprising:
    a thin magnetoresistive film extending in a direction perpendicular to a magnetic recording medium and having a magnetic easy axis perpendicular to a direction of movement of said magnetic recording medium;
    electrodes formed on said thin magnetoresistive film at both end parts and a central part thereof in the direction of the magnetic easy axis of said thin magnetoresistive film to provide current to said thin magnetoresistive film such that said current flows from both of said end parts toward said central part of said thin magnetoresistsive film so as to produce at least one magnetic field around said thin magnetoresistive film; and a high-permeability magnetic body magnetically coupled with and electrically isolated from said thin magnetoresistive film and disposed parallel to and spaced from said thin magnetoresistive film in the direction of the movement of said magnetic recording medium such that said at least one magnetic field produced by said current flowing in said thin magnetoresistive film is shifted to produce at least one bias magnetic field across said thin film magnetoresistive film wherein said high-permeability magnetic body is a non-permanent magnetic member enabling shifting of said at least one magnetic field produced by said current flowing in said thin magnetoresistive film without the use of any additional current to generate a magnetic field by said non-permanent magnetic member.

2. A soft-film-bias type magnetoresistive device according to claim 1, wherein said high-permeability magnetic body is a thin high-permeability magnetic film.

3. A soft-film-bias type magnetoresistive device according to claim 1, wherein said high-permeability magnetic body is cut into two separate parts at a position corresponding to the electrode which is disposed at the central part of said thin magnetoresistive film.

4. A soft-film-bias type magneto-resistive device according to claim 2, wherein said high-permeability magnetic body is cut into two separate parts at a position corresponding to the electrode which is disposed at the central part of said thin magnetoresistive film.

5. A soft-film-bias type magneto-resistive device according to claim 1, wherein said high-permeability magnetic body is constricted at a position corresponding to the electrode which is disposed at the central part of said thin magnetoresistive film.

6. A soft-film-bias type magneto-resistive device according to claim 2, wherein said high-permeability magnetic body is constricted at a position corresponding to the electrode which is disposed at the central part of said thin magnetoresistive film.

7. A soft-film-bias type magnetoresistive device according to claim 1, wherein said high-permeability magnetic body is a massive body.

8. A soft-film-bias type magnetoresistive device according to claim 1, wherein at least one magnetic shielding body is provided on both sides of said soft-film-bias type magnetoresistive device.

9. A soft-film-bias type magneto-resistive device according to claim 8, wherein said high-permeability magnetic body also acts as a magnetic shielding body.

10. A soft-film-bias type magnetoresistive device according to claim 8, wherein at least one of said magnetic shielding bodies is a thin magnetic shielding film.

11. A soft-film-bias type magnetoresistive device according to claim 8, wherein at least one of said magnetic shielding bodies is a massive magnetic shielding body.

* * * * *